United States Patent [19]

Boissel et al.

[11] Patent Number: 4,508,967
[45] Date of Patent: Apr. 2, 1985

[54] ELECTRONIC OPTICAL APPARATUS COMPRISING PYROLYTIC GRAPHITE ELEMENTS

[75] Inventors: Pierre Boissel; Mathias Tong, both of Courbevoie, France

[73] Assignee: Cameca, Courbevoie, France

[21] Appl. No.: 457,233

[22] Filed: Jan. 11, 1983

[30] Foreign Application Priority Data

Jan. 22, 1982 [FR] France .................... 82 01010

[51] Int. Cl.³ ............................. G01N 23/00
[52] U.S. Cl. ................... 250/396 R; 250/310; 250/505.1
[58] Field of Search ........ 250/310, 396, 505; 313/293, 106

[56] References Cited

U.S. PATENT DOCUMENTS 3,634,684  1/1972  Sato .
4,220,889  9/1980  Marhic et al. ............... 313/38
4,387,320  6/1983  Hoet ......................... 313/293
4,417,175 11/1983  Carren et al. ............... 313/106

FOREIGN PATENT DOCUMENTS 1066583  4/1967  United Kingdom .

OTHER PUBLICATIONS

"Spectrometer Shield for Stray Iron X-Ray Radiation in the Scanning Electron Microscope", Ballard et al., Rev. of Sci. Inst., vol. 42, No. 1, Jan. 1971.

Primary Examiner—Bruce C. Anderson
Attorney, Agent, or Firm—Cushman, Darby & Cushman

[57] ABSTRACT

The electronic optical apparatus provided is such that the parts situated in the immediate vicinity of the beam, anode, screen placed inside the condenser block, screen formed from a tube and limiter diaphragms inside the deflection block, screen placed between the final focussing lens and the sample to be observed and the secondary electron collector electrode have their faces exposed to the electron beam formed from pyrolytic graphite.

6 Claims, 5 Drawing Figures

ELECTRONIC OPTICAL APPARATUS COMPRISING PYROLYTIC GRAPHITE ELEMENTS

BACKGROUND OF THE INVENTION

The invention relates to electronic optical apparatus and more particularly to an improvement of this type of apparatus.

In an electron scan microscope or an electron probe X ray analyzer, the sample to be observed or to be analyzed is subjected to bombardment by the electrons of an electron beam, generated by an electron gun then deflected and focussed for scanning the sample.

Over the whole path of the electron beam, the parts situated in the immediate vicinity thereof are struck by primary electrons, and back-scattered parasite electrons disturb the useful beam, causing limitation of the spatial resolution of the apparatus both for observation and X ray analysis. This back-scattering occurs more particularly at the level of the anode of the electron gun and of the protecting tube passing through the condensor block of the beam, as well as at the level of the deflection block in front of the final focussing lens of the beam.

To partially resolve this problem, in some apparatus of this type, screens are disposed, at selected locations, to eliminate these parasite electrons so as to limit the disturbance of the useful beam.

The invention relates to an improved electronic optical apparatus in that the number of parasite electrons disturbing the beam is considerably reduced with respect to that existing in apparatus of this type in which the protecting screens are usually made from metal, for example stainless steel or copper alloys.

SUMMARY OF THE INVENTION

The invention provides an electronic optical apparatus comprising an electron gun, a condenser block for the electronic beam coming from the gun, a deflection and focussing block for the beam coming from the condenser block and a useful signal detection device, wherein the tubular screens surrounding the beam inside the condenser block and the deflection block are formed from a vacuum tight outer part and an inner part formed from pyrolytic graphite.

BRIEF DESCRIPTION OF THE DRAWINGS

The invention will be better understood and other features will appear from the following description with reference to the accompanying figures.

DESCRIPTION OF THE PREFERRED EMBODIMENTS

The electronic optical apparatus of the invention is such that, over the whole length of the electron beam path, the screens and tubes situated in the immediate vicinity of the beam are formed, at least partially, from pyrolytic graphite so as to reduce the generation of parasite electrons.

This material has in fact special properties which, in combination, make it a material particularly well suited to this application.

Figure 1:
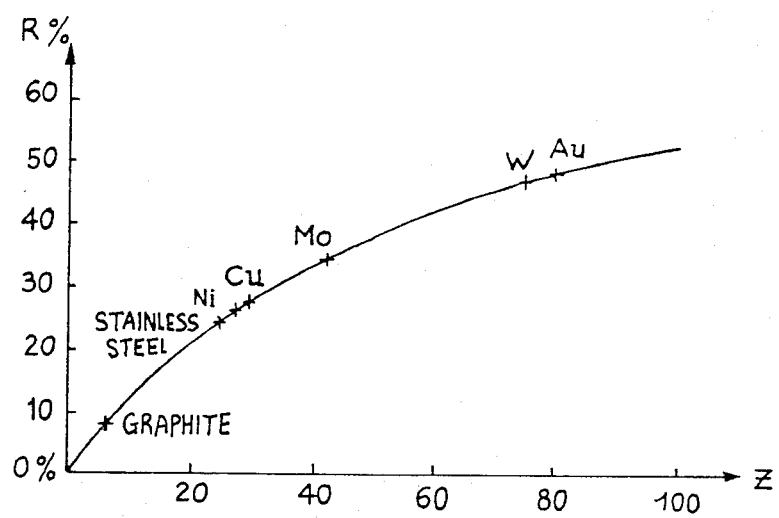
FIG. 1 is a curve giving in a first approximation the values of the electron back-scattering coefficients of a number of materials as a function of their mean atomic number.

The first of these properties is that graphite has an electron back-scattering coefficient appreciably smaller than the materials usually used for forming the screens and tubes situated in the vicinity of the beam, stainless steel or copper alloys for example. The electron back-scattering coefficient, R (in percentage), decreases in fact with the atomic number of the materials. FIG. 1 shows this variation of R as a function of Z, the points relative to stainless steel (a material generally used for forming the anode of the electron gun, the tubes and the screens), gold (Au), tungsten (W), molybdenum (Mo), copper (Cu), and to nickel (Ni) having been shown in this curve.

However, to form these parts for an electronic optical apparatus, it is also indispensable for the thermal and mechanical properties of the material chosen to be suitable. In fact, in this type of apparatus, the thermal stresses may be high and a simple industrial graphite deposit would not present sufficient qualities of thermal and mechanical stability.

Pyrolytic graphite has determining advantages. This graphite, also called "orientated" graphite, is essentially a crystallized graphite obtained by thermal decomposition of a hydrocarbon gas on the surface of a material heated to a very high temperature in a controlled atmosphere. The thickness of the layer obtained depends on the duration of the decomposition process. The conditions in which the deposit takes place affect the structure and the mechanical properties of the layer obtained.

From the thermal point of view, this material has a high resistance to thermal shocks and great stability. Moreover, pyrolytic graphite has a high thermal radiation capability.

Moreover, its mechanical resistance is very high and, contrary to what happens for other materials, it increases with the temperature.

The introduction of parts formed or coated with this material in an electronic optical apparatus of the microprobe or scanning electron microscope type, along the whole electron beam path, improves the power of resolution of these apparatus.

Figure 2:
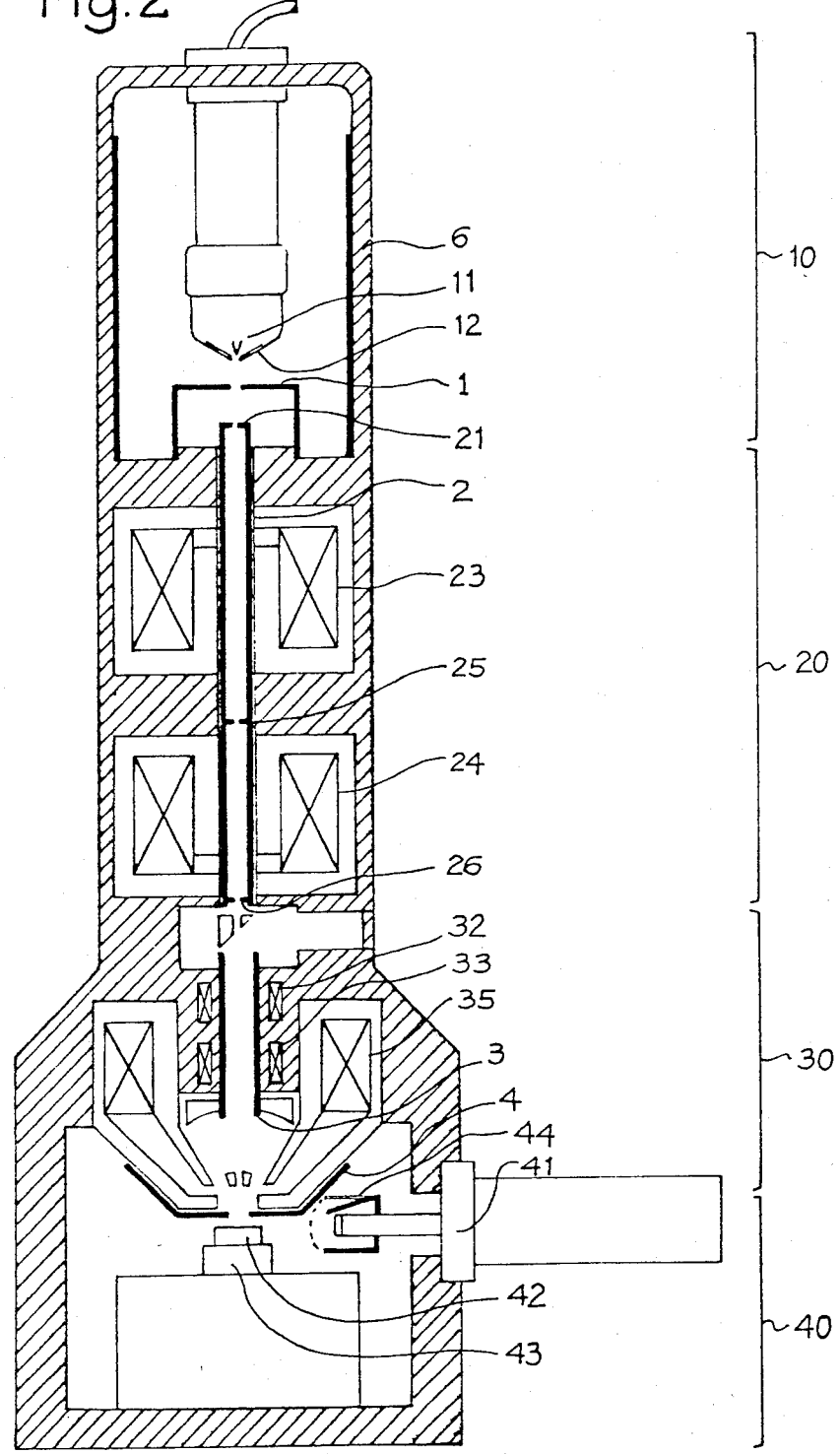
FIG. 2 is a general diagram of one embodiment of an electronic device in accordance with the invention.

FIG. 2 shows schematically an electron microscope in which this improvement is incorporated.

This type of apparatus comprises principally four zones: the electron gun 10 in which is generated an electron beam, a condenser block 20, in which the initial beam normally undergoes a high intensity reduction so as to supply at its output the useful beam, a deflection block 30, in which this beam is deflected for scanning the sample to be analyzed then focussed on this sample and finally chamber 40 in which the sample to be analyzed is placed as well as the secondary electron detection device.

Figure 3:
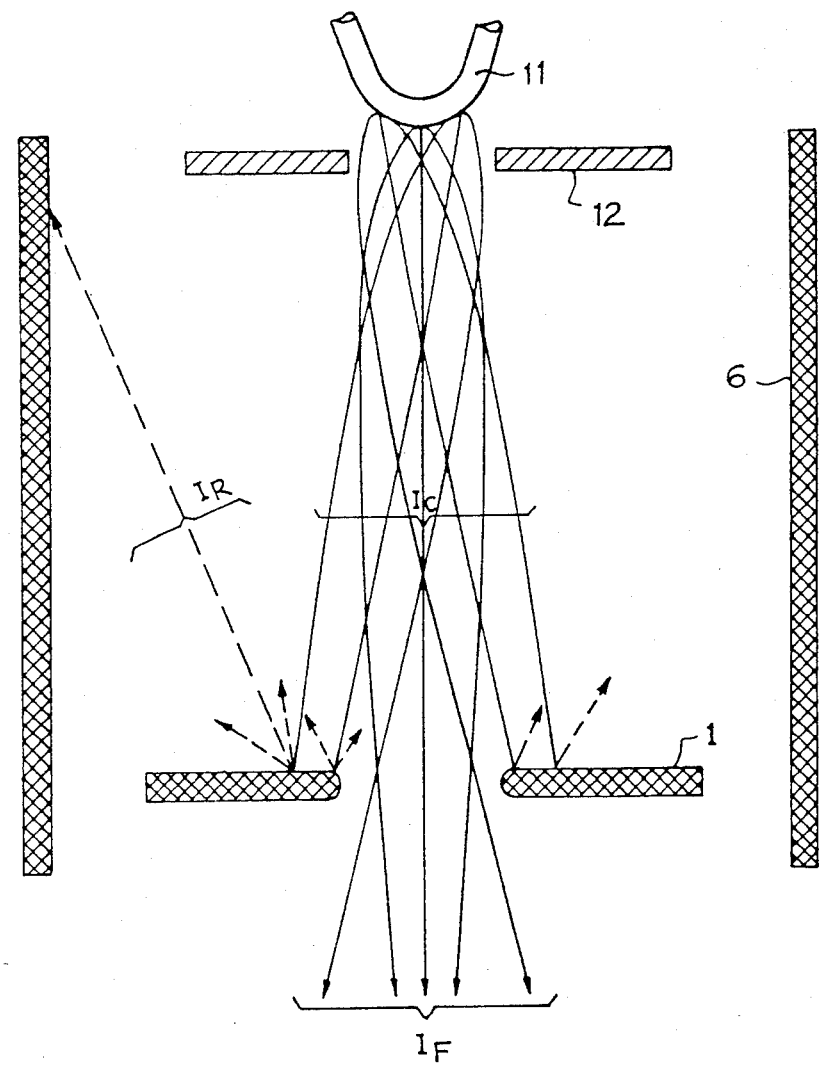
FIGS. 3, 4 and 5 are diagrams of details of the apparatus shown in FIG. 2.

The electron gun comprises principally the filament 11, the Wehnelt 12 and anode 1 in a vacuum enclosure and the power supply means, not described in detail here. FIG. 3 shows the essential elements 11, 12, 1 of this gun. The anode is a disk with a central hole therethrough for the passage of the beam. A part of the electron beam of intensity $I_C$ emitted by the filament is transmitted to the condenser block ($I_F$ being the electron intensity of the beam at the input of this block).

Another part strikes the anode 1 and is itself partly back-scattered. In the most improved version of the apparatus of the invention, this anode 1 is made from pyrolytic graphite, which considerably reduces the intensity of the re-emitted electron beam, $I_R$, typically by a factor of 5 with respect to the intensity back-scattered by a stainless steel anode for example. Since the electron current received by the anode is high, one or more micro-amperes for a detected secondary electron emission current, after analysis of the sample, of the order of a pico-ampere, the anode usually produces up to a few tens of micro-amperes of parasite electrons, which are difficult to eliminate by traps. An anode formed from pyrolytic graphite leads to an initial "cleaner" beam and to a lower space charge, which improves the qualities of the gun.

An improvement, shown in FIGS. 2 and 3, consists in forming a screening 6 also made from a layer of pyrolytic graphite on the internal side face of the electron gun.

Figure 4:
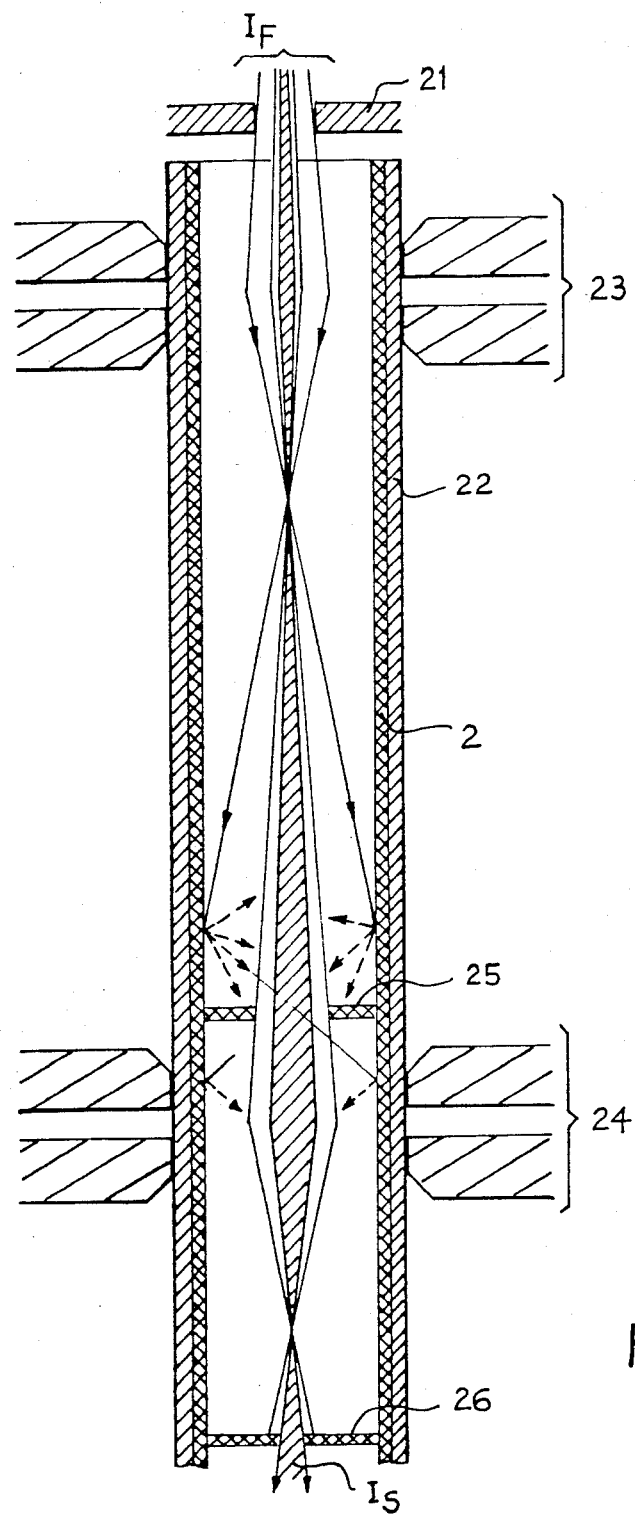

In condenser block 20, shown in greater detail in FIG. 4, the initial beam from the gun, of intensity $I_F$, is concentrated by electro-magnetic lenses 23, 24 and passes through one or more limiter diaphragms 21, 25, 26 for supplying a useful beam of intensity $I_S$ between a pico-ampere and a few hundred nano-amperes and parasite electrons coming from the electron back-scattering from the diaphragms on the protection tubes. According to an essential feature of the invention, the protection tube 2 is made from pyrolytic graphite which considerably reduces the parasite electron rate at this level of the apparatus. In practice, considering the fact that the tube must also be vacuum tight, it comprises an outer metal part 22 and an inner part 2 made from pyrolytic graphite. The limiter diaphragms may also be advantageously formed from pyrolytic graphite. In FIG. 4 diaphragms 25 and 26 are shown as formed from this material.

Figure 5:
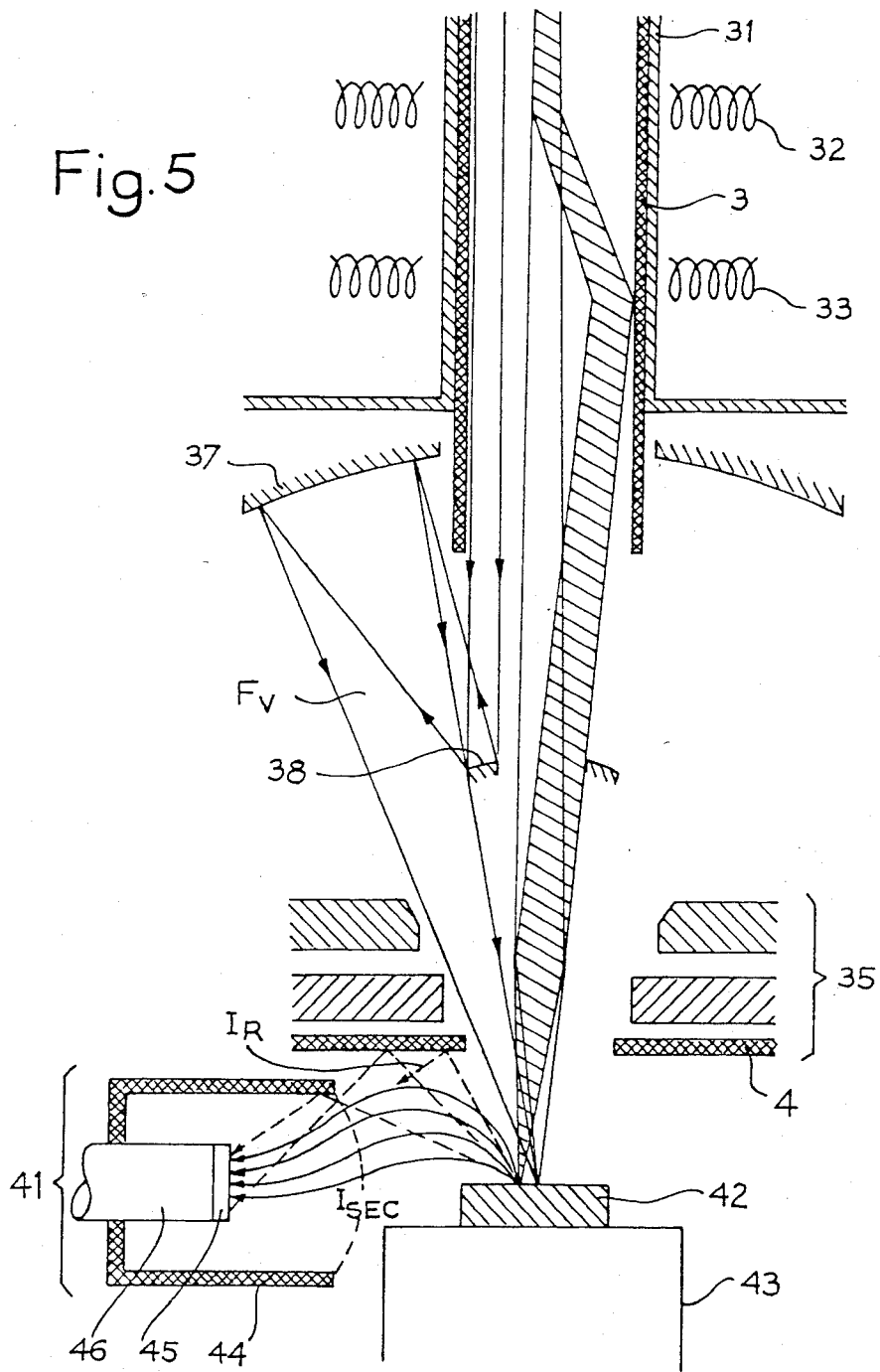

In deflection block 5 shown in greater detail in FIG. 5, the beam undergoes no attenuation, but only a succession of deflections by displacement coils 32 and 33. The beam has been shown without deflection and with deflection (hatched beam). The apparatus comprises at this level a tubular screen which traps the residual parasite electrons leaving the condenser block. According to a second essential feature of the invention, this tubular screen is formed, like the protection tube of the condenser, from an outer metal part 31 and an inner pyrolytic graphite part 3.

In one embodiment, this type of instrument further comprises visible light observation means shown, partially, in FIG. 5. For the observation to take place under good conditions, it is desirable for the tubular screen of the deflection block inside which passes the visible light beam $F_V$ focussed by the photonic lens 37, 38, to have low reflecting power. Pyrolytic graphite, since it approximates a black body, advantageously replaces any anti-reflection coating which might give off gas and deteriorate the vacuum conditions in the apparatus.

The deflected electron beam is then focussed by a focussing lens 35 on the sample 42 carried by a stage 43.

In the last zone of the apparatus, the electron beam striking the sample, with effective intensity $I_u$, gives rise to the emission of secondary electrons of intensity $I_{sec}$ characteristic of the sample and forming a useful signal to be detected by the detection device 41. But because of the back-scattering of primary electrons back-scattered from sample 42 then by the surface of the last part on the axis of the beam, parasite electrons of intensity $I_R$ are also received by the detector and disturb the useful signal. Furthermore, in some embodiments, a screen 4 cooled to the temperature of liquid nitrogen is placed between the focussing lens 35 and the object so as to improve the vacuum conditions in the apparatus and thus reduce contamination of the object by the hydrocarbon deposits which occur under the effect of the impact of the beam. Multiple electron reemission between the sample and the screen gives rise in the detector to a parasite signal.

According to a complementary feature of the apparatus of the invention, screen 4, called "anticontamination" screen, is also made from pyrolytic graphite, which considerably reduces the parasite signal. This screen may be a disk, pierced centrally, or a calotte of revolution about the axis of the beam, taking on exactly the shape of the last part of the apparatus in the vicinity of the beam.

The detection device 41 is formed in the embodiment shown by a collector electrode 44, a scintillator 45 and a light guide 46 coupled to a photomultiplier not shown. The purpose of the collector electrode 44 is to create an electric field for capturing the secondary electrons forming the useful signal; they are then attracted by the scintillator itself biassed very positively. Furthermore, the electrons back-scattered by the object and its environment reach this electrode, which back-scatters them partially so that some reach the scintillator and form a parasite signal.

To reduce the intensity of this signal, the collector electrode 44 is also made from pyrolytic graphite.

The invention is not limited to the apparatus described with reference to the figures and it comes within the scope of the invention to add to the elements described above other screens or limiter diaphragms formed from pyrolytic graphite along the path of the electron beam where appreciable back-scattering phenomena might occur and disturb the correct operation of the apparatus.

What is claimed is:

1. In an electronic optical apparatus comprising an electron gun, a condenser block for the electron beam coming from the gun, a deflection and focussing block for the beam coming from the condenser block and a useful signal detection device, the tubular screen surrounding the beam inside the condenser block and the deflection block are formed from a vacuum tight outer part and an inner part formed from pyrolytic graphite.

2. The apparatus as claimed in claim 1, wherein the anode of the electron gun is a part of revolution formed from pyrolytic graphite pierced with a hole for the passage of the beam therethrough.

3. The apparatus as claimed in claim 2, wherein the internal face of the side wall of the electron gun is coated at least partially with a layer of pyrolytic graphite.

4. The apparatus as claimed in claim 3, wherein the focussing lens for the electron beam is separated from the object stand by an anticontamination screen formed from pyrolytic graphite.

5. The apparatus as claimed in claim 4, wherein the condenser tube comprises at least one limiter diaphragm in the form of a disk, pierced with a hole of selected size, formed from pyrolytic graphite.

6. The apparatus as claimed in claim 5, wherein the useful signal detection device comprises a secondary electron collector electrode formed from pyrolytic graphite.

* * * * *